(12) United States Patent
Yeh et al.

(10) Patent No.: US 8,338,837 B2
(45) Date of Patent: Dec. 25, 2012

(54) LIGHT EMITTING DEVICE

(75) Inventors: Wen-Yung Yeh, Hukou Township, Hsinchu County (TW); Hsi-Hsuan Yen, Taipei (TW); Tse-Peng Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 183 days.

(21) Appl. No.: 12/794,843

(22) Filed: Jun. 7, 2010

(65) Prior Publication Data

US 2010/0308347 A1    Dec. 9, 2010

Related U.S. Application Data

(60) Provisional application No. 61/184,869, filed on Jun. 8, 2009.

(51) Int. Cl.
*H01L 33/00* (2010.01)
(52) U.S. Cl. ......... 257/88; 257/81; 257/84; 257/E25.02; 257/E33.034

(58) Field of Classification Search .............. 257/81, 257/84, 88, E25.02, E33.034, E31.001
See application file for complete search history.

(56) References Cited

U.S. PATENT DOCUMENTS

| 7,221,044 B2 | 5/2007 | Fan et al. | |
| 2005/0224822 A1* | 10/2005 | Liu | 257/84 |
| 2008/0042558 A1* | 2/2008 | Buchhauser et al. | 313/504 |
| 2008/0106212 A1* | 5/2008 | Yen et al. | 315/192 |

* cited by examiner

*Primary Examiner* — Banjamin Sandvik
*Assistant Examiner* — Whitney T Moore
(74) *Attorney, Agent, or Firm* — Bacon & Thomas, PLLC (57) ABSTRACT

A light emitting device includes a plurality of micro diodes, which are electrically connected to constitute a bridge rectifier circuit. Each branch of the bridge rectifier circuit includes a single micro diode or a plurality of micro diodes. The light emitting device is electrically connected to an AC power source, which alternately drives the light emitting device in two current loops. Therefore, the micro diodes in two current loops of the bridge rectifier circuit emit light by turns.

20 Claims, 9 Drawing Sheets

LIGHT EMITTING DEVICE

This application claims the benefit of Provisional application Ser. No. 61/184,869, filed Jun. 8, 2009, the subject matter of which is incorporated herein by reference.

TECHNICAL FIELD

The invention relates in general to a light emitting device, and more particularly to a light emitting device having a bridge rectifier circuit.

BACKGROUND

Due to the advancement of manufacturing technology, light emitting diodes (LEDs) have been widely used in solid-state lighting products. According to physical characteristics of the LED, the LED is mostly suggested to be supplied with low voltage and direct current. Thus, LED is usually incorporated with step-down transformer and AC-to-DC converter whenever only high-voltage alternating current is available. However, the transformer and the converter usually occupy a large volume and are too heavy for the user to carry around. In addition, as alternating current is transformed into direct current, it is always accompanied with the problem of energy waste. Thus, it is crucial for the manufacturers to provide LED related products with higher efficiency.

SUMMARY

According to an embodiment, a light emitting device comprises: a substrate; a plurality of adhesive layers disposed on the substrate; and a plurality of micro diodes disposed on the substrate, the micro diodes are electrically connected to constitute a bridge rectifier circuit and bond to the substrate via the adhesive layers, wherein the micro diodes comprise at least one light emitting micro diode disposed on a middle branch of the bridge rectifier circuit, and a plurality of Schottky Barrier Diodes disposed on remainder branches of the bridge rectifier circuit and embedded in the substrate.

Other objects, features, and advantages of the invention will become apparent from the following detailed description of the preferred but non-limiting embodiments. The following description is made with reference to the accompanying drawings.

DETAILED DESCRIPTION

The AC/DC light emitting device in the disclosure makes use of a bridge rectifier circuit as its basic circuit structure, and also is incorporated with flip-chip technology or the concept of thin film LED. Light emitting micro diodes or Schottky Barrier Diodes are electrically connected to constitute a bridge rectifier circuit. In the manufacturing process of the AC/DC light emitting device, light emitting micro diodes of the light emitting device can be bonded to a heat dissipating substrate other than an original substrate by adhesive layers to improve heat dissipating capacity and light emitting efficiency. The heat dissipating substrate can be a replaced substrate or a sub-mount. And the electrical wiring can be formed on the surfaces of the light emitting micro diodes, the replaced substrate or the sub-mount. In addition, the light emitting micro diodes or the Schottky Barrier Diodes in each circuit branch of the bridged rectified circuit can be electrically connected in series, in parallel or in a mixing combination of series and parallel. Moreover, other electronic elements can be formed on the replaced substrate and electrically connected with the light emitting micro diodes of the AC/DC light emitting device, so as to increase the efficiency, reliability, and lifespan of the AC/DC light emitting device. Several embodiments of the circuit structures of the AC/DC light emitting device are introduced in the following descriptions with drawings.

Figure 1A:
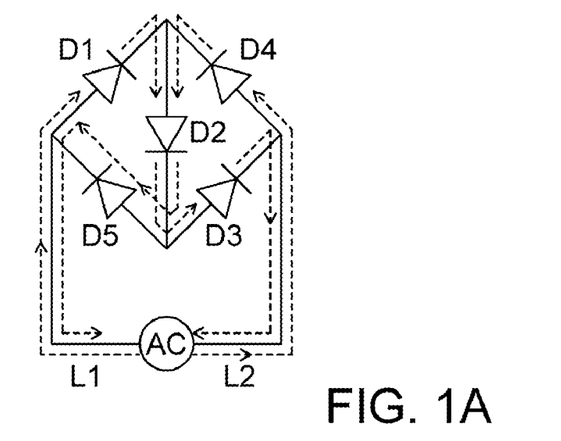
FIG. 1A is an equivalent circuit diagram of an AC/DC light emitting device according to the invention.

FIG. 1A is an equivalent circuit diagram of an AC/DC light emitting device according to one embodiment. The AC/DC light emitting device is a Wheatstone Bridge-type AC-LED. As shown in FIG. 1A, the AC/DC light emitting device includes a plurality of light emitting micro diodes, which are electrically connected and constitute a bridge rectifier circuit. Each branch of the bridge rectifier circuit includes a single light emitting micro diode or a plurality of light emitting micro diodes. For example, each branch in FIG. 1A has one light emitting micro diode, such as D1 to D5. It is noted that the light emitting micro diodes of the bridge rectifier circuit are formed on a single substrate, such as a chip. The AC/DC light emitting device is electrically connected to an AC power source, which alternately drives the AC/DC light emitting device in two current loops L1 and L2. Therefore, the light emitting micro diodes D1, D2, D3 on the current loop L1 and the light emitting micro diodes D4, D2, D5 on the current loop L2 emit light by turns. According to the bridge rectifier circuit structure of the AC/DC light emitting device, the light emitting micro diode D2 on the middle branch is driven in a bi-direction. The amount of light emitting micro diode on each branch can be changed to increase the light emitting efficiency and the chip area utilization rate of the AC/DC light emitting device. Therefore, the ratio of the amount of light emitting micro diodes on the middle branch to the amount of light emitting micro diodes on the remainder branches can be calculated and designed to achieve a higher light emitting efficiency and the chip area utilization rate.

Figure 1B:
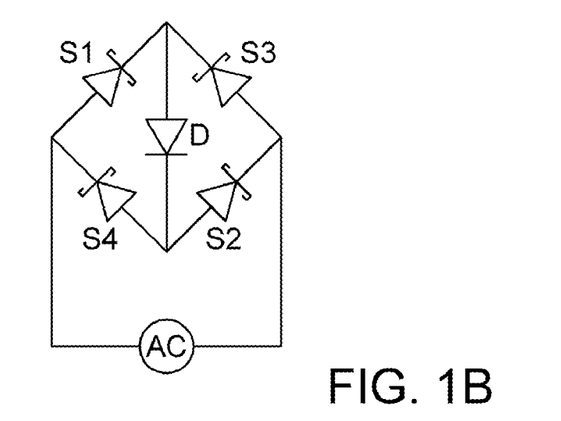
FIG. 1B is an equivalent circuit diagram of an AC/DC light emitting device according to the invention.

FIG. 1B is an equivalent circuit diagram of an AC/DC light emitting device according to one embodiment. As shown in FIG. 1B, the AC/DC light emitting device includes at least one light emitting micro diode D and a plurality of Schottky Barrier Diodes (SBDs) S1 to S4 to constitute a bridge rectifier circuit. The light emitting micro diode D is disposed on the middle branch, and the SBDs S1 to S4 are disposed on the remainder branches to rectify an alternating current. In some embodiments, the middle branch can have more than one light emitting micro diodes thereon to increase the lighting efficiency of the AC/DC light emitting device. For example, when the power supply is 110V, the amount of the light emitting micro diodes is about 22-32 or more. When the power supply is 220V, the amount of the light emitting micro diodes is about 50-60 or more. Because the SBDs can resist high reverse voltage, there is no need to use too many SBDs on the four rectifying branches of the bridge rectifier circuit. For example, each branch can just have one SBD, and the amount of the light emitting micro diodes on the middle branch can be predetermined according to need and limitation. In some embodiments, each branch of the AC/DC light emitting device can have more than one SBD and is not limited to one SBD as shown in FIG. 1B. Since the light emitting micro diodes on the middle branch receives current from the AC power source all the time, they keep on emitting light and provide high light emitting efficiency. The cross sectional view of the light emitting micro diodes on the middle branch are described in FIGS. 16-22, and will be explained more details thereinafter.

Figure 2:
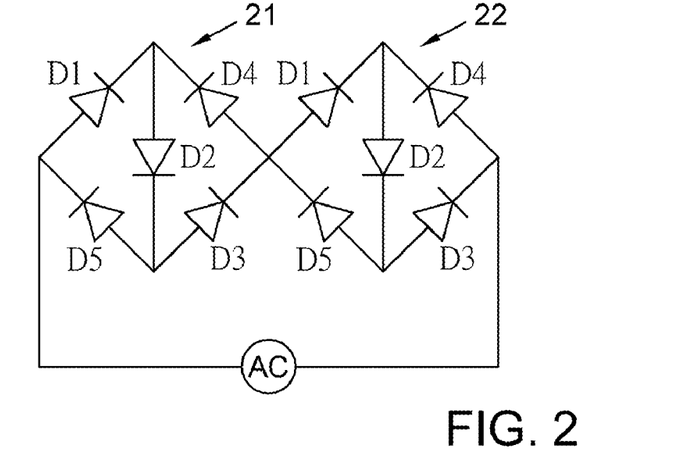
FIG. 2 is an equivalent circuit diagram of an AC/DC light emitting device according to the invention.

FIG. 2 is an equivalent circuit diagram of an AC/DC light emitting device according to one embodiment. The circuit structure of the AC/DC light emitting device is constituted by at least two bridge rectifier circuits 21 and 22 in series connection.

Figure 3:
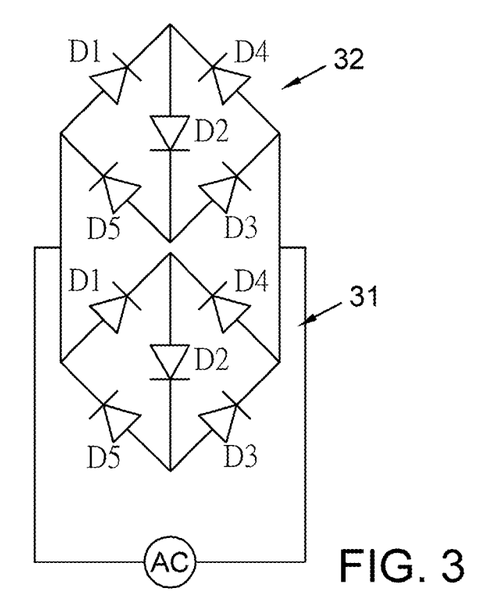
FIG. 3 is an equivalent circuit diagram of an AC/DC light emitting device according to the invention.

FIG. 3 is an equivalent circuit diagram of an AC/DC light emitting device according to one embodiment. The circuit structure of the AC/DC light emitting device is constituted by at least two bridge rectifier circuits 31 and 32 connected in parallel.

Figure 4A:
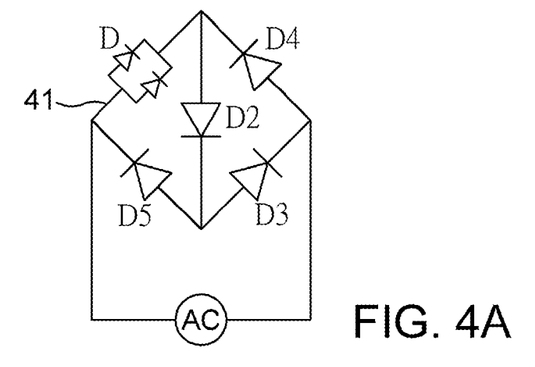
FIGS. 4A and 4B are equivalent circuit diagrams of an AC/DC light emitting device according to the invention.
Figure 4B:
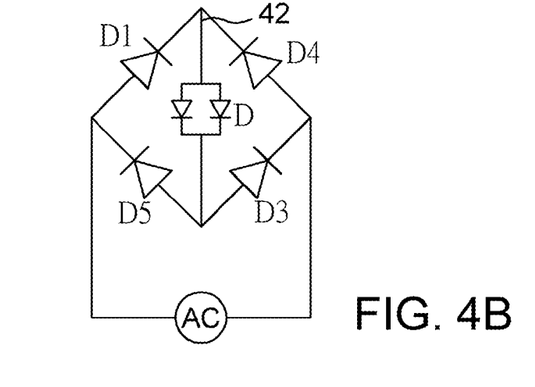
Figure 5:
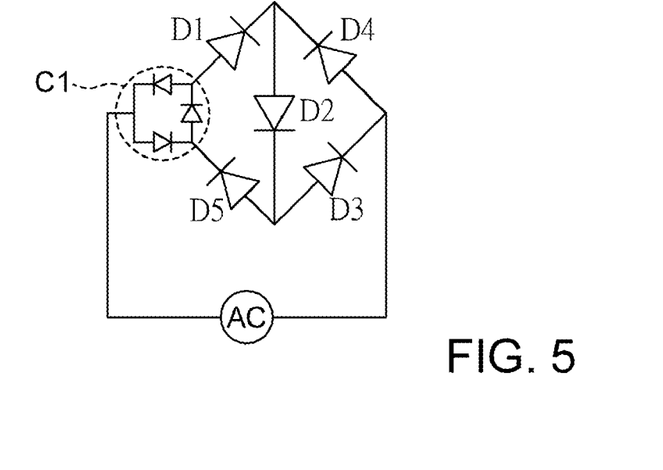
FIGS. 5 to 9 are equivalent circuit diagrams of an AC/DC light emitting device having more complicated bridge rectifier circuits according to other embodiments of the invention.
Figure 6:
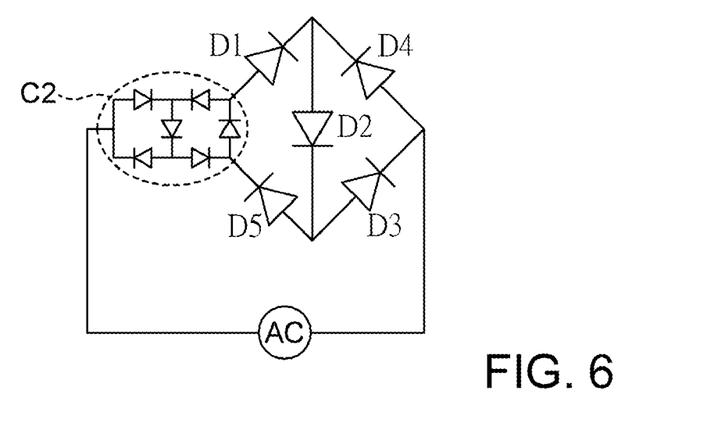
Figure 7:
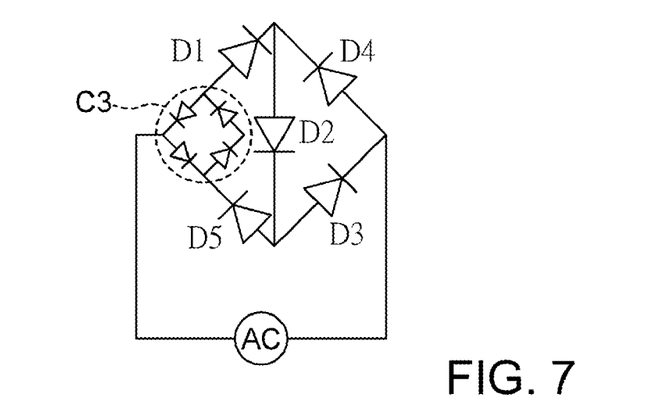
Figure 8:
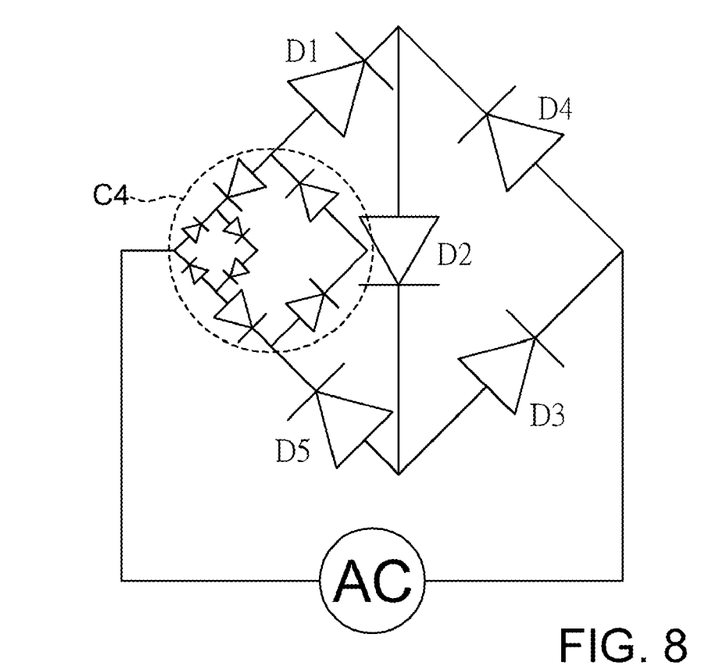
Figure 9:
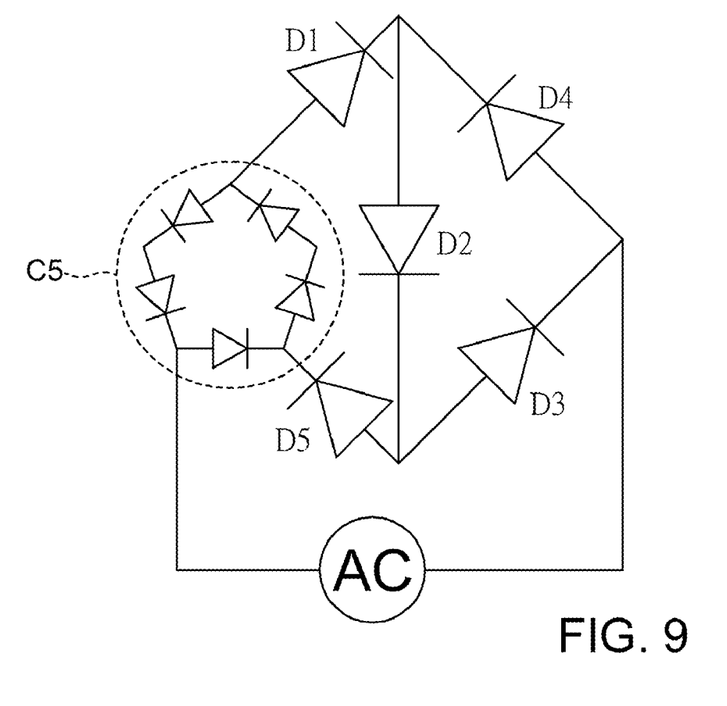

FIGS. 4A and 4B are equivalent circuit diagrams of an AC/DC light emitting device according to other embodiments. At least one branch of the bridge rectifier circuit, such as the side branch 41 in FIG. 4A and the middle branch 42 in FIG. 4B, has several the light emitting micro diodes electrically connected in parallel, in series (not shown) or in a mixing combination of parallel and series (not shown).

FIGS. 5 to 9 are equivalent circuit diagrams of an AC/DC light emitting device having more complicated bridge rectifier circuits according to other embodiments. As shown in each diagram, the bridge rectifier circuit of the AC/DC light emitting device is further incorporated with one or more rectifier branches (marked by dashed line circles C1 to C5).

Figure 10A:
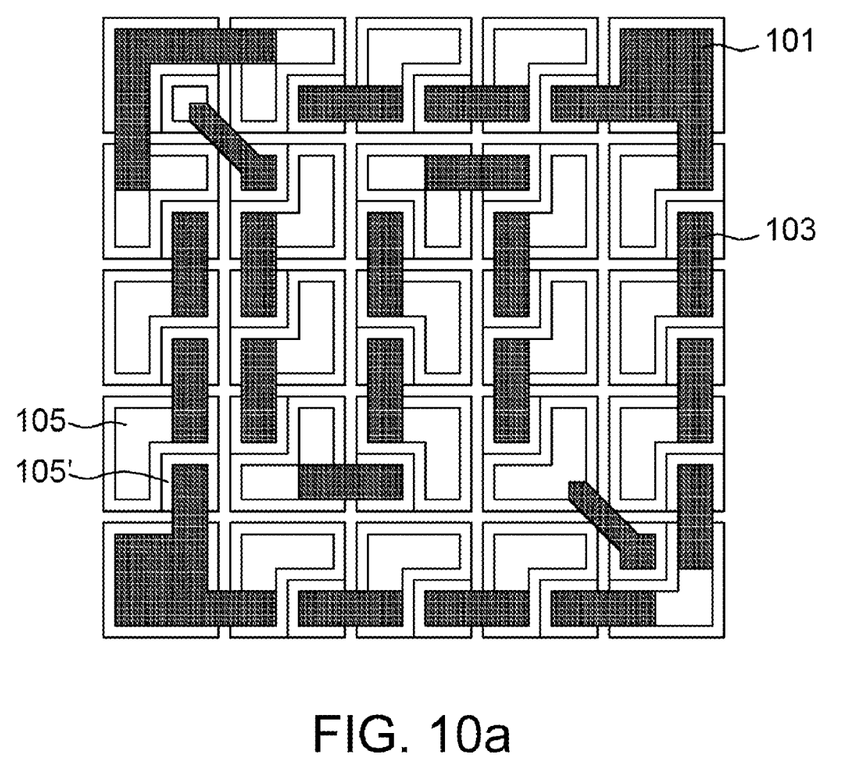
FIG. 10a is a top view structure of an AC/DC light emitting device according to an embodiment of the invention.

FIG. 10a is a top view structure of an AC/DC light emitting device according to one embodiment. The AC/DC light emitting device is a Wheatstone Bridge-type AC-LED, which, for example, includes bonding pads 101, conductive connecting layer 103, contact metals 105 and 105', etc. The cross sectional view diagram of the AC/DC light emitting devices described above with flip chip package is shown in FIG. 10b.

Figure 10B:
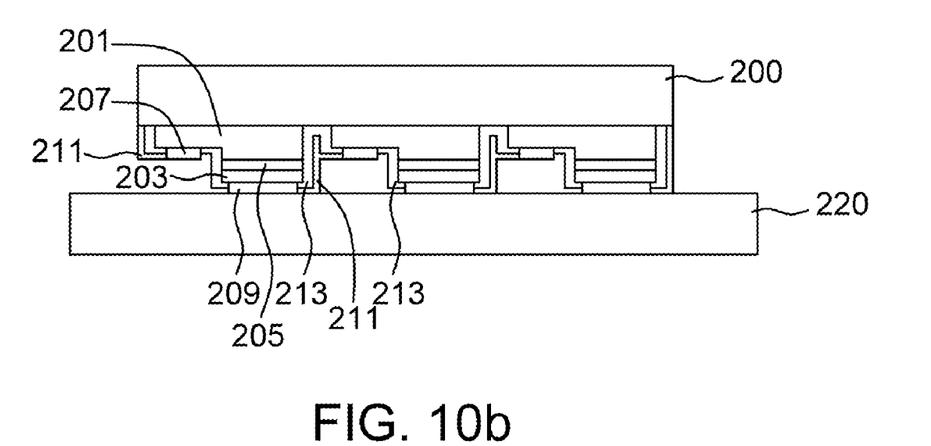
FIG. 10b is a cross sectional view diagram of an AC/DC light emitting device according to an embodiment of the invention.

In order to increase the heat dissipating capacity and the lighting efficiency of the AC/DC light emitting device, the AC/DC light emitting device can adopt a flip chip LED structure as shown in FIG. 10b. FIG. 10b is a cross-section view of AC/DC light emitting device. In FIG. 10b, the light emitting micro diodes of the AC/DC light emitting device are grown on an original single substrate 200. Each of the light emitting micro diodes has two semiconductor layers 201, 203, an active layer 205 and two opposite electrodes 207, 209. The active layer 205 is disposed between the semiconductor layers 201, 203, and the electrodes 207, 209 are respectively in contact with the semiconductor layers 201, 203. One of the semiconductor layers is p-type semiconductor, and the other one is n-type semiconductor. The material of the semiconductor layers 201, 203 is selected from GaP, GaAs, GaAsP, InGaP, AlGAInP, AlGaAs, GaN, InGaN, AlGaN, ZnSe or other material. The thickness of the active layer 205 is, for example, smaller than 300 nm. When the material of the semiconductor layers 201, 203 is GaN, the thickness of the thin film LED is about 1-4 um, preferable to 2-3 um. A plurality of conductive connecting layers 211 formed with conductive connecting material, such as metal, electrically connect the electrodes 207, 209 of the light emitting micro diodes. And, a plurality of insulating layers 213 formed with a dielectric material, such as silicon oxide, cover the outer surface of light emitting micro diodes to avoid short circuit occurring between semiconductor layers 201, 203, the active layers 205 and the conductive connecting layers 211. In some embodiment, the material of the original substrate 200 is sapphire. Because the heat dissipating capacity of sapphire substrate 200 is not good enough, the light emitting micro diodes with the original substrate 200 are turned upside down to bond with a replaced substrate 220 with higher heat dissipating capacity. The adhesive layer or the bonding structure used to bond the light emitting micro diodes to the replaced substrate 220 can be their electrodes 209.

Figure 11:
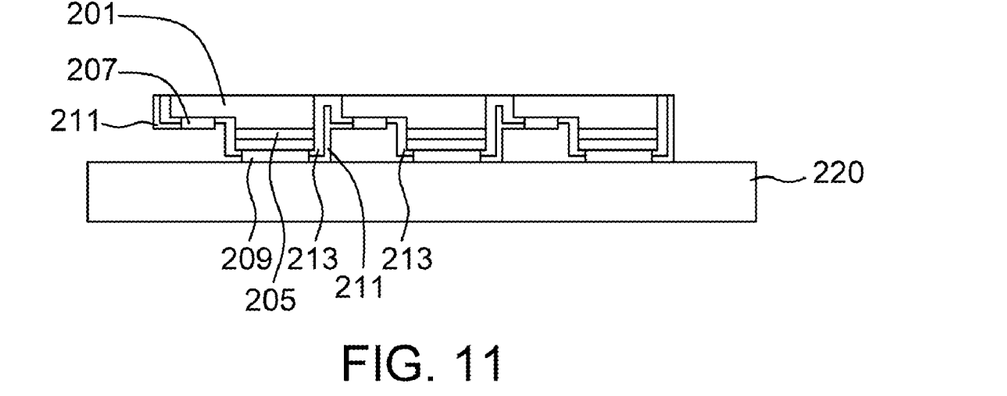
FIG. 11 is a cross sectional view diagram of an AC/DC light emitting device removing the original substrate of FIG. 10b according to an embodiment of the invention.

When manufacturing the AC/DC light emitting device, the conductive connecting layers 211 and the insulating layers 213 are formed on the light emitting micro diodes on the original substrate 200 such as a sapphire substrate in advance. Then, the original substrate 200 loaded with the light emitting micro diodes is turned upside down, so as to be attached to a replaced substrate 220 by bonding. Afterwards, the original substrate 200 can be removed, and the surfaces of the light emitting micro diodes opposite to the replaced substrate 220 are uncovered, as shown in FIG. 11. The uncovered surfaces can be roughened for increasing light emitting efficiency.

Figure 12:
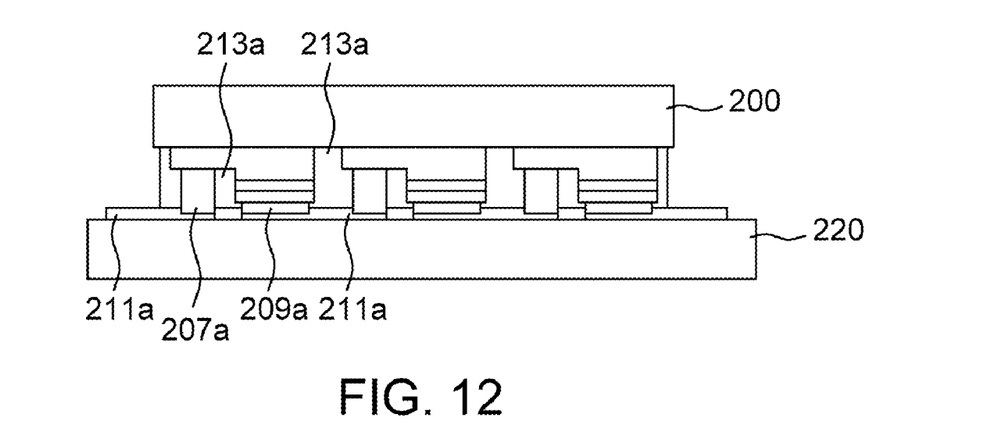
FIGS. 12-22 are cross sectional view diagrams of an AC/DC light emitting device according to other embodiments of the invention.

A flattening step can be integrated in the process of manufacturing the AC/DC light emitting device. As shown in FIG. 12, the light emitting micro diodes are grown on an original substrate 220, and the gaps between the light emitting micro diodes are filled with an insulating material, such as silicon oxide, to form insulating layers 213a. The electrodes 207a, 209a and the insulating layers 213a are aligned to a nearly the same horizontal plane by a flattening step. A chemical mechanical polishing (CMP) method can be used in the flattening step. After the flattening step, the conductive connecting layers 211a are formed on the insulating layers 213a for electrically connecting the electrodes 207a, 209a. Then, the original substrate 220 with the light emitting micro diodes are turned upside down to let the electrodes 207a, 209a and conductive connecting layers 211a of the light emitting micro diodes to bond to the replaced substrate 220. The adhesive layer or bonding structure used to bond the light emitting micro diodes to the replaced substrate 220 are the electrodes 207a, 209a and the conductive connecting layers 211a. It is noted that, the electrodes 207a, 209a and the conductive connecting layers 211a contain adhesive material so that the light emitting micro diodes can be directly attached to the replaced substrate 220 by the electrodes 207a, 209a and the conductive connecting layers 211a. In some embodiment, the original substrate 220 can be removed.

Figure 13:
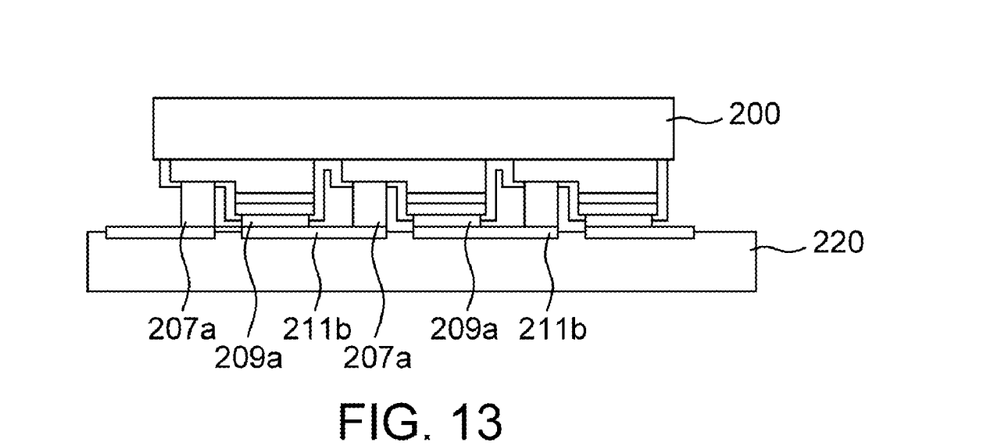

The conductive connecting layers mentioned above are formed on the light emitting micro diodes before attaching the light emitting micro diodes to the replaced substrate. However, as shown in FIG. 13, the conductive connecting layers 211b can be formed on the replaced substrate 220 beforehand by, for example, metal evaporation, diffusion, or ion implantation, so as to provide low resistance path for current between the light emitting micro diodes. Then, the original substrate 200 with the light emitting micro diodes are turned upside down to let the electrodes 207a, 209a to bond to the conductive connecting layers 211b on the replaced substrate 220.

Figure 14:
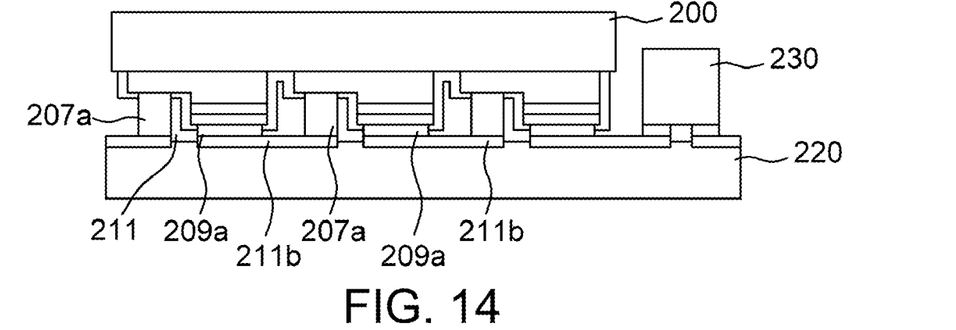

The AC/DC light emitting device can be incorporated with other electronic elements. Take the AC/DC light emitting device of FIG. 13 for example, as shown in FIG. 14, an electronic element 230 is disposed on the replaced substrate 220 and electrically connected to the AC/DC light emitting device for providing additional functions. The electronic element 230 can be electrically connected to the AC/DC light emitting device in series or in parallel. Alternatively, the electronic element 230 is, for example, a capacitor, a converter, a transformer, a surge absorber, a high electron mobility transistor (HEMT) or an electrostatic discharge (ESD) protection circuit, etc., and also is applicable to the AC/DC light emitting device of the preceding drawings. In some embodiment, the electronic element 230 can be integrated into the AC/DC light emitting device. The electronic element 230 can be the SBDs S1-S4 which have been mentioned in FIG. 1B.

Figure 15:
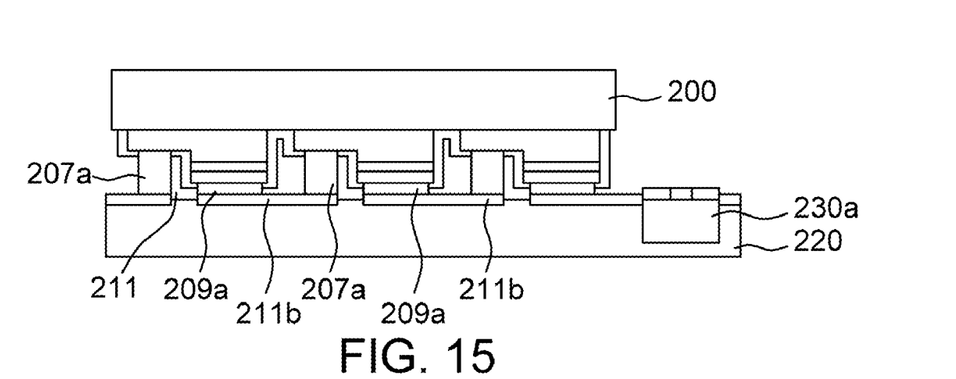

As shown in FIG. 15, the electronic element 230a providing additional function can be embedded in the replaced substrate 220, or formed as a part of the replaced substrate 220 in condition that the characteristic of the material of the replaced substrate 220 permits. For example, as the replaced substrate 220 is a semiconductor substrate such as silicon substrate or silicon carbide (SiC), the electronic element 230a (such as the SBDs S1-S4 in the FIG. 1B) can be formed by ion implantation applied to the semiconductor substrate. The ion used for implantation can be hydrogen ion (H+). In addition, the electronic element 230a is, for example, a capacitor, a converter, a transformer, a surge absorber, a high electron mobility transistor (HEMT) or an electrostatic discharge (ESD) protection circuit, and the metal material formed on the replaced substrate 220 is selected from Al, Ti, Ni, Au, Cu, Pt or other metals.

Figure 16:
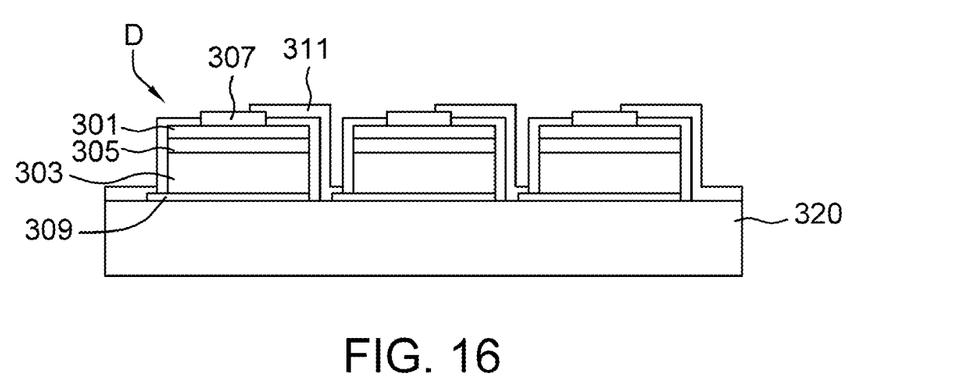

FIG. 16 show an AC/DC light emitting device formed by thin film-type light emitting micro diodes. The light emitting micro diodes D, each including two semiconductor layers 301, 303 and an active layer 305, are vertical-type with upper electrodes 307 on the top and bottom electrodes 309 in the bottom. One of the semiconductor layers 301, 303 is p-type semiconductor, and the other one is n-type semiconductor. The material of the semiconductor layers 301, 303 is selected from GaP, GaAs, GaAsP, InGaP, AlGAInP, AlGaAs, GaN, InGaN, AlGaN, ZnSe or other material. The thickness of the active layer 305 is, for example, smaller than 300 nm. When the material of the semiconductor layers 301, 303 is GaN, the thickness of the thin film LED is about 1-4 um, preferable to 2-3 um. The light emitting micro diodes are bonded on a replaced substrate 320 by adhesive layers. In some embodiments, the adhesive layers or the bonding structure can be the bottom electrodes 309. As the replaced substrate 320 is an insulating substrate, the adhesive layers can be conductive and be used as the material of electrodes 309. A plurality of conductive connecting layers 311 formed with conductive connecting material, such as metal, electrically connect the electrodes 307, 309 of the light emitting micro diodes D.

Figure 17:
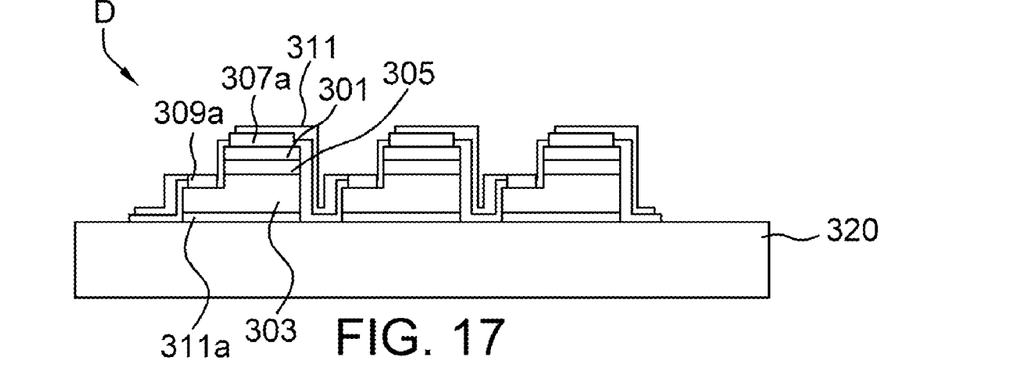

Unlike the electrodes 307, 309 of the light emitting micro diodes located at opposite sides in FIG. 16, the electrodes 307a, 309a of the light emitting micro diodes are formed at the same side, as shown in FIG. 17. The light emitting micro diodes are horizontal-type with electrodes 307a, 309a on the same side. Therefore, unlike the embodiment of FIG. 16, the light emitting micro diodes are bonded on the replaced substrate 320 by additional adhesive layers 311a, not bottom electrodes. The material of the adhesive layers 311a can be an organic adhesive, such as polyimide, benzoyclobutene (BCB), or perfluorocyclobutane (PFCB).

Figure 18:
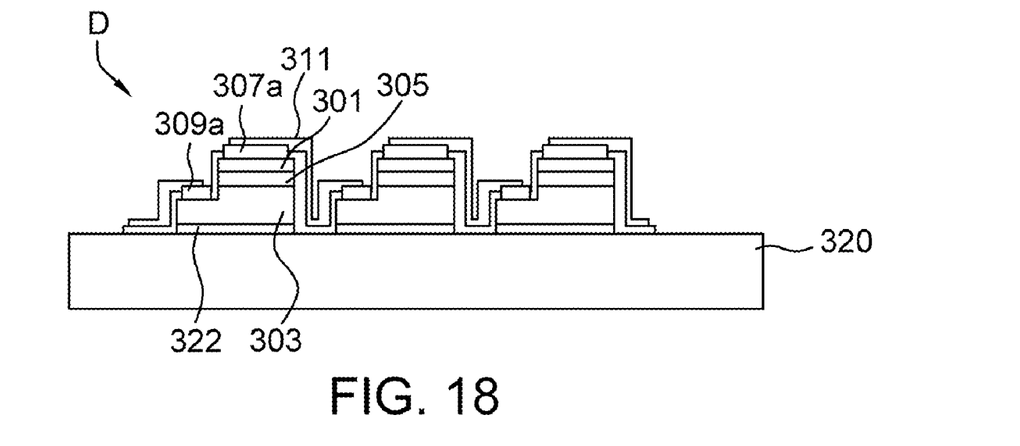
Figure 19:
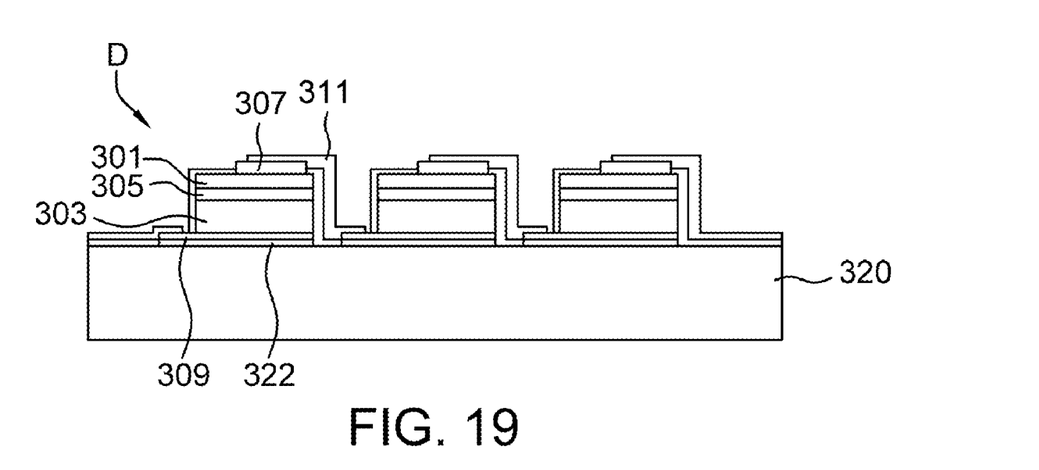

As shown in FIGS. 18 and 19, no matter the electrodes 307a, 309a are located on the same side or the electrodes 307, 309 are located on two opposite sides of the light emitting micro diodes, as long as the replaced substrate 320 is a conductive substrate, an insulating bonding layer 322 is disposed between the semiconductor layer 303 and the replaced substrate 320 or between the bottom electrode 309 and the replaced substrate 320 to prevent electrical leakage. The material of the insulating bonding layer 322 can be an organic adhesive, such as polyimide, benzoyclobutene (BCB), or perfluorocyclobutane (PFCB).

Figure 20:
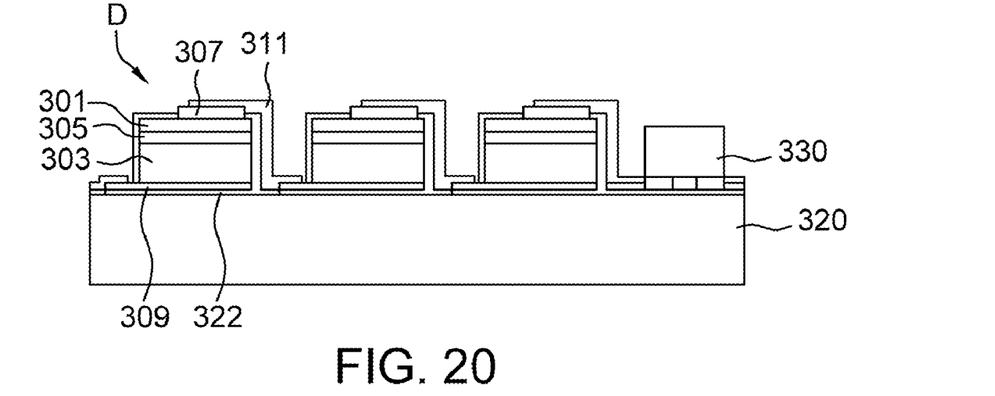
Figure 21:
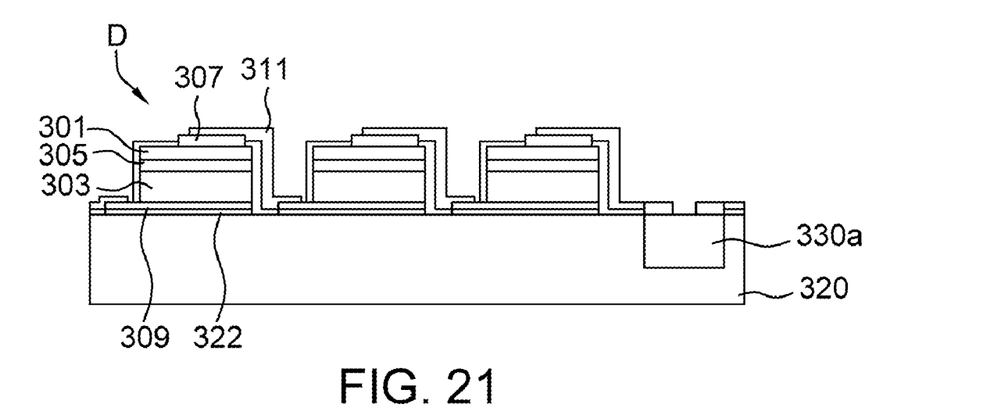

As shown in FIGS. 20 to 21, the AC/DC light emitting device formed by thin film-type light emitting micro diodes can also be incorporated with other electronic element 330, such as a capacitor, a converter, a transformer, a surge absorber, a high electron mobility transistor (HEMT) or an ESD protection circuit. And, the electronic element 330a can also be directly embedded in the replaced substrate 320, or formed as a part of the replaced substrate 320. The electronic element 330 or 330a can also be the SBD mentioned above in the FIG. 1B. For example, as the replaced substrate 320 is a semiconductor substrate such as silicon substrate or silicon carbide (SIC), the electronic element 330a (such as the SBDs S1-S4 in the FIG. 1B) can be formed by ion implantation applied to the semiconductor substrate. The ion used for implantation can be hydrogen ion (H+). In addition, the electronic element 330a is, for example, a capacitor, a converter, a transformer, a surge absorber, a high electron mobility transistor (HEMT) or an electrostatic discharge (ESD) protection circuit, and the metal material formed on the replaced substrate 320 is selected from Al, Ti, Ni, Au, Cu, Pt or other metals.

The electronic element 330 or 330a can be electrically connected to the AC/DC light emitting device in series, in parallel or in a mixing combination of series and parallel.

Figure 22:
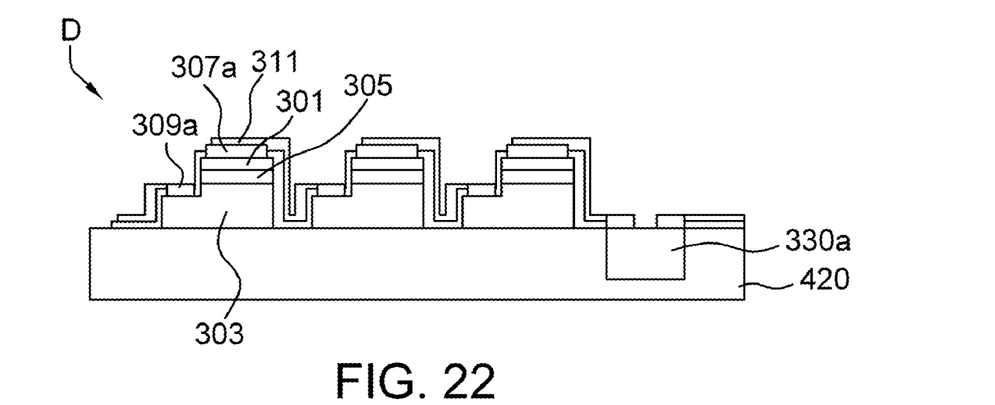

In FIG. 22, the material of the original substrate 420 can be silicon carbide (SiC) or other semiconductor material. Because silicon carbide has good heat dissipating capacity, the light emitting micro diodes can be grown directly on the silicon carbide substrate 420 without introducing a flip chip or thin film manufacturing process to bond on another heat dissipating substrate.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A light emitting device, comprising:
a substrate;
a plurality of adhesive layers, disposed on the substrate; and
a plurality of micro diodes disposed on the substrate, electrically connected to constitute a bridge rectifier circuit and bond to the substrate via the adhesive layers, wherein the micro diodes comprise a plurality of light emitting micro diodes disposed on a middle branch of the bridge rectifier circuit, and a plurality of Schottky Barrier Diodes disposed on remainder branches of the bridge rectifier circuit;

wherein the plurality of Schottky Barrier Diodes are embedded in the substrate.

2. The light emitting device according to claim 1, wherein the light emitting micro diodes on the middle branch of the bridge rectifier circuit are driven in a bi-direction.

3. The light emitting device according to claim 1, wherein the micro diodes are electrically connected to constitute more than two of the bridge rectifier circuits connected in series.

4. The light emitting device according to claim 1, wherein the micro diodes are electrically connected to constitute more than two of the bridge rectifier circuits connected in parallel.

5. The light emitting device according to claim 1, wherein the bridge rectifier circuit is further incorporated with at least one rectifier branch.

6. The light emitting device according to claim 1, wherein the adhesive layers are used as bottom electrodes of the micro diodes and to bond the micro diodes to the substrate.

7. The light emitting device according to claim 1, further comprising a plurality of conductive connecting layers formed on the light emitting micro diodes and electrically connected between electrodes of the light emitting micro diodes.

8. The light emitting device according to claim 7, wherein the conductive connecting layers are formed on the light emitting micro diodes by metal evaporation, diffusion, or ion implantation.

9. The light emitting device according to claim 1, wherein the micro diodes are horizontal-type diodes with electrodes on a same side thereof.

10. The light emitting device according to claim 1, further comprising an electronic element disposed on the substrate or embedded in the substrate and electrically connected to the micron diodes.

11. The light emitting device according to claim 10, the electronic element includes a capacitor, a converter, a transformer, a surge absorber, a high electron mobility transistor (HEMT) or an electrostatic discharge (ESD) protection circuit.

12. The light emitting device according to claim 1, wherein the micro diodes are vertical-type diodes with electrodes on opposite side thereof.

13. The light emitting device according to claim 1, wherein the substrate is a silicon substrate or made of silicon carbide (SIC).

14. The light emitting device according to claim 1, wherein the substrate is a conductive substrate, the adhesive layers includes insulating bonding layers.

15. The light emitting device according to claim 14, wherein a material of the insulating bonding layer is selected from an organic adhesive including polyimide, benzoyclobutene (BCB), or perfluorocyclobutane (PFCB).

16. The light emitting device according to claim 1, wherein a material of the adhesive layers is selected from an organic adhesive including polyimide, benzoyclobutene (BCB), or perfluorocyclobutane (PFCB).

17. The light emitting device according to claim 1, wherein each light emitting micro diode includes two semiconductor layers and an active layer between the two semiconductor layers, and a material of the semiconductor layers is selected from GaP, GaAs, GaAsP, InGaP, AIGAInP, AlGaAs, GaN, InGaN, AlGaN or ZnSe.

18. The light emitting device according to claim 17, wherein a thickness of the active layer is smaller than 300 nm.

19. The light emitting device according to claim 17, wherein when the material of the semiconductor layers is GaN, a thickness of the light emitting device is less than 4 um.

20. The light emitting device according to claim 1, wherein the light emitting device is a Wheatstone Bridge-type AC-LED.

* * * * *